United States Patent
Vinayak et al.

(10) Patent No.: US 7,741,903 B2
(45) Date of Patent: Jun. 22, 2010

(54) DISTORTION-DRIVEN POWER AMPLIFIER POWER SUPPLY CONTROLLER

(75) Inventors: Vikas Vinayak, Menlo Park, CA (US); Serge Francois Drogi, Flagstaff, AZ (US); Martin Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 41 days.

(21) Appl. No.: 12/175,146

(22) Filed: Jul. 17, 2008

(65) Prior Publication Data

US 2009/0021303 A1  Jan. 22, 2009

Related U.S. Application Data

(60) Provisional application No. 60/950,273, filed on Jul. 17, 2007.

(51) Int. Cl.
*H03F 1/32* (2006.01)
*H03G 3/20* (2006.01)
(52) U.S. Cl. ........................ 330/127; 330/149
(58) Field of Classification Search ................ 330/149, 330/127, 297, 279, 134
See application file for complete search history.

(56) References Cited

U.S. PATENT DOCUMENTS

| | | | |
|---|---|---|---|
| 6,166,598 A | * | 12/2000 | Schlueter .................... 330/127 |
| 6,348,781 B1 | | 2/2002 | Midya et al. |
| 6,912,377 B2 | | 6/2005 | Hayashihara |
| 7,026,868 B2 | | 4/2006 | Robinson et al. |
| 2002/0145470 A1 | | 10/2002 | Staudinger et al. |

* cited by examiner

*Primary Examiner*—Robert Pascal
*Assistant Examiner*—Hieu P Nguyen
(74) *Attorney, Agent, or Firm*—Fenwick & West LLP

(57) ABSTRACT

A power amplifier controller measures the distortion of a power amplifier output. Based upon the distortion measured, the supply voltage to the PA is adjusted in a control loop. In one embodiment, distortion is measured by computing the ratio of the measured power in the output frequencies outside the desired output channel to the measured power in the output frequencies within the desired channel. If the distortion measured from the PA is higher than a target distortion level, the power supply voltage is raised. If the distortion measured from the PA is lower than the target distortion level, the power supply voltage is reduced. Thus, the supply voltage to the PA is maintained at the lowest possible voltage level, improving the efficiency of the PA.

26 Claims, 6 Drawing Sheets

DISTORTION-DRIVEN POWER AMPLIFIER POWER SUPPLY CONTROLLER

CROSS-REFERENCE TO RELATED APPLICATIONS

This application claims priority under 35 U.S.C. §119(e) from co-pending U.S. Provisional Patent Application No. 60/950,273 entitled "Distortion-Driven Power Amplifier Power Supply Controller" filed on Jul. 17, 2007, the content of which is incorporated by reference herein in its entirety.

BACKGROUND

1. Field of the Invention

The present invention relates to a circuit for controlling RF PAs (Radio Frequency Power Amplifiers), and more specifically, to an RF PA controller circuit that adjusts the supply voltage of RF PAs.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life of these portable electronic devices. For example, cellular telephone makers make great efforts to increase the efficiency of the RF PA systems, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. In some cases, there may be a filter between the TXIC 102 and the PA 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic devices. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) as its last amplification stage. When an RF modulated signal 106 is amplified by the PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the PA 104 to sacrifice more efficiency. For instance, while the efficiency at peak power of an output transistor of the PA 104 can be above 60%, when a modulation format such as WCDMA is used, with certain types of coding, the efficiency of the PA 104 falls to below 30%. This change in performance is due to the fact that the RF transistor(s) in the PA 104 is maintained at an almost fixed bias during the off-peak of the amplitude of the RF input signal 106.

Certain conventional techniques exist to provide efficiency gains in the PA 104. One conventional technique is EER (Envelope Elimination and Restoration). The EER technique applies the amplitude signal (not shown in FIG. 1) and the phase signal (not shown in FIG. 1) of the RF input signal 106 separately to 2 ports of the power amplifier 104, i.e., its supply voltage port (Vcc) 108 and its RF input port 107, respectively. However, the EER technique often fails to provide significant efficiency gains, because the supply voltage 108 cannot be varied in an energy-efficient way to accommodate the large variations in the amplitude signal of the RF input signal 106; and thus, it fails to provide a substantial energy efficiency gain while maintaining the required linear amplification of the RF signal in the PA 104. This is mainly due to the difficulty in realizing a fast, accurate, wide range, and energy efficient voltage converter to drive the supply voltage of the PA 104.

The conventional EER technique can function better only if a variable power supply with a very large variation range is used to adjust the supply voltage based on the amplitude signal of the RF input signal 106, while not reducing the efficiency of the RF transmitter by the power consumed by the power supply itself. However, the variable power supply, which is typically comprised of a linear regulator (not shown in FIG. 1) that varies its output voltage on a fixed current load such as the PA 104 in linear mode, by principle reduces the supply voltage at constant current and by itself consumes the power resulting from its current multiplied by the voltage drop across the linear regulator when there is a large drop in the amplitude signal of the RF input signal 106. This results in no change in the overall battery power being consumed by the RF transmitter because any efficiency gained in the PA 104 is mostly lost in the linear regulator itself.

Variations of the EER technique, such as Envelope Following and other various types of polar modulation methods, likewise fails to result in any significant gain in efficiency in the RF transmitter, because the supply voltage is likewise adjusted based on the amplitude signal of the RF input signal 106 which inherently has large variations; and thus, has the same deficiencies as described above with respect to conventional EER techniques.

Some other conventional techniques improve the efficiency in the PA 104 by lowering the supply voltage 108 to the PA 104. In many of these techniques, both amplitude and phase components of the RF input signal 106 are fed to the PA 104 in a conventional manner. By using a lower supply voltage 108, the PA 104 operates with increased power efficiency because it operates closer to the saturation point. However, the supply voltage 108 cannot be reduced too low, because this would cause the PA 104 to operate with insufficient voltage headroom, resulting in unacceptable distortion. As described previously, the distortion may cause energy from the transmitted signal to spill over to adjacent channels, increasing spectral occupancy and causing interference to radios operating in those neighboring channels. Thus, an optimal supply voltage can be chosen for the PA which balances acceptable distortion with good efficiency.

One conventional method uses a step-down switched mode power supply (SMPS) (i.e., buck regulator) to lower the supply voltage 108 to the PA 104. However, choosing a fixed power supply voltage is not sufficient in many applications. For example, in most cellular systems, the PA output power changes frequently because the base station commands the cellular handset to adjust its transmitted power to improve network performance, or because the handset changes its transmitted information rate. When the PA output power changes, the optimum supply voltage for the PA (as described above) changes.

Therefore, in some systems, the expected power of the RF output signal 110 is first determined, and then the power supply voltage 108 is adjusted in accordance with the expected power. By adaptively adjusting the supply voltage 108, the efficiency of the PA 104 is increased across various PA output power levels. Conventional methods estimate the expected power of the RF output signal 110 in an "open loop" manner, in which the power of the RF output signal 110 is estimated from the power of the delivered RF input signal 106. This method does not yield an accurate estimate of the power of the RF output signal 110 because the estimated power may vary according to various operating conditions, such as temperature and frequency. Therefore, even if the estimated power at some point approximates the actual power, changes in operating conditions result in deviation of the estimated power from the actual power.

Moreover, an estimate of the power of the RF output signal 110 may not be sufficient for properly adjusting the supply voltage 108. For example, the peak-to-average ratio (PAR) needs to be known in order to estimate the optimum supply voltage for the PA. The PAR refers to the difference of the mean amplitude and the peak amplitude in the modulated RF output signal 110. With a higher PAR, a higher supply voltage is needed to accommodate the peak voltage swings of the RF output signal 110. Many modern cellular systems change the PAR of the modulation in real time, requiring the supply voltage to be adjusted accordingly. Therefore, the conventional method of adjusting the supply voltage 108 of PA 104 based on an estimate of the PA output power is unsuitable in these cellular systems.

Further, the load presented to the PA 104 poses another problem. The PA 104 normally drives circuitry usually consisting of a filter and an antenna. Such circuitry often has an impedance around the range of 50 ohms. The impedance of the circuitry can sometime change radically. For example, if the antenna is touched or the cellular device is laid down on a metal surface, the impedance of the circuitry changes. The changes in the impedance of the circuitry coupled to the PA 104 may require changes in the supply voltage to the PA 104 to prevent distortion of the RF output signal 110 fed to this circuitry. The conventional methods described above, however, do not adjust the supply voltage in response to changes in the impedance of the circuitry.

Although the problems of inaccurate estimation of power at the RF output signal 110, changing PAR, and impedance changes at the output of PA 104 can be avoided by constantly providing a higher than optimum supply voltage to the PA 104, the higher supply voltage leads to a less efficient PA 104.

Thus, there is a need for a PA system that is efficient over a wide variety of modulation techniques and results in a significant net increase in power efficiency of the PA system. Additionally, there is a need for a PA controller that can adjust the power supply for the PA under conditions of varying temperature, frequency, output power, PAR, and impedance to maximize the PA efficiency while keeping distortion to an acceptable level.

SUMMARY

A power amplifier controller circuit includes a distortion measurement module for determining a measured distortion level of an output signal of a power amplifier (PA). A comparator compares the measured distortion level to a target distortion level and generates a power supply control signal indicative of the difference between the measured distortion level and the target distortion level. Based upon the power supply control signal, a power supply adjusts the supply voltage to the PA. If the power supply control signal indicates that the measured distortion level is higher than the target distortion level, the power supply raises the supply voltage to the PA. If the power supply control signal indicates that the measured distortion level is lower than the target distortion level, the power supply reduces the supply voltage to the PA. Thus, the supply voltage to the PA is maintained at the lowest possible voltage level, improving the efficiency of the PA.

In one embodiment, the circuit determines the measured distortion level of the PA by computing a ratio between the measured power in the output frequencies of the PA output signal outside a desired output channel and the measured power in the output frequencies of the PA output signal within the desired channel. The measured distortion level is compared to the target distortion level to determine if the power supply voltage should be raised or lowered. In one embodiment, the circuit further comprises a phase correction loop to correct for phase distortion, thus ensuring that a majority of the distortion in the PA output arises from amplitude distortion.

An advantage of the power amplifier controller according to the embodiments of the present invention is that it greatly increases the efficiency of the power amplifier by keeping the supply voltage of the power amplifier as low as possible while maintaining the distortion of the output signal near a predetermined level. Moreover, because the supply voltage of the power amplifier is adjusted according to the level of distortion in the output signal, the supply voltage can be accurately established, thus maximizing the overall efficiency of the power amplifier.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
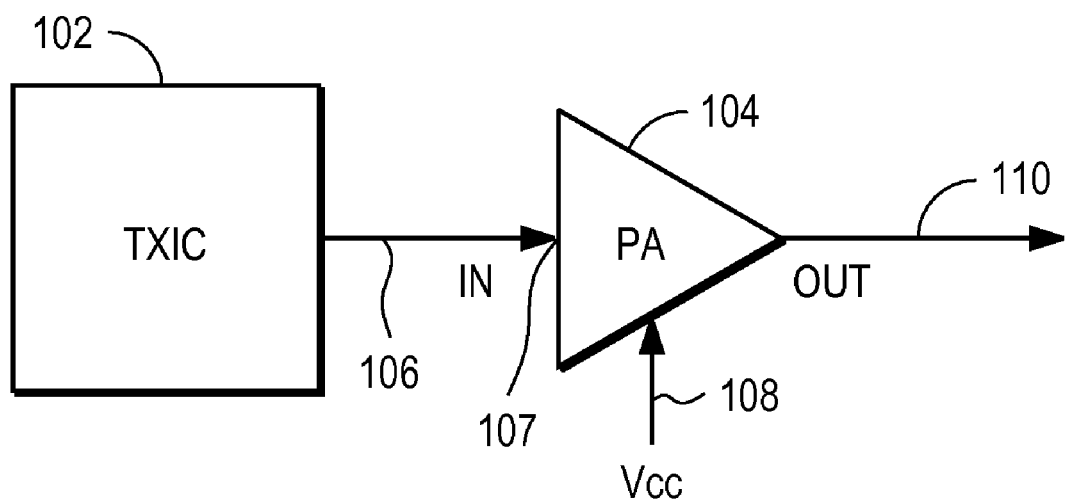
FIG. 1 illustrates a conventional RF transmitter configuration.
Figure 2:
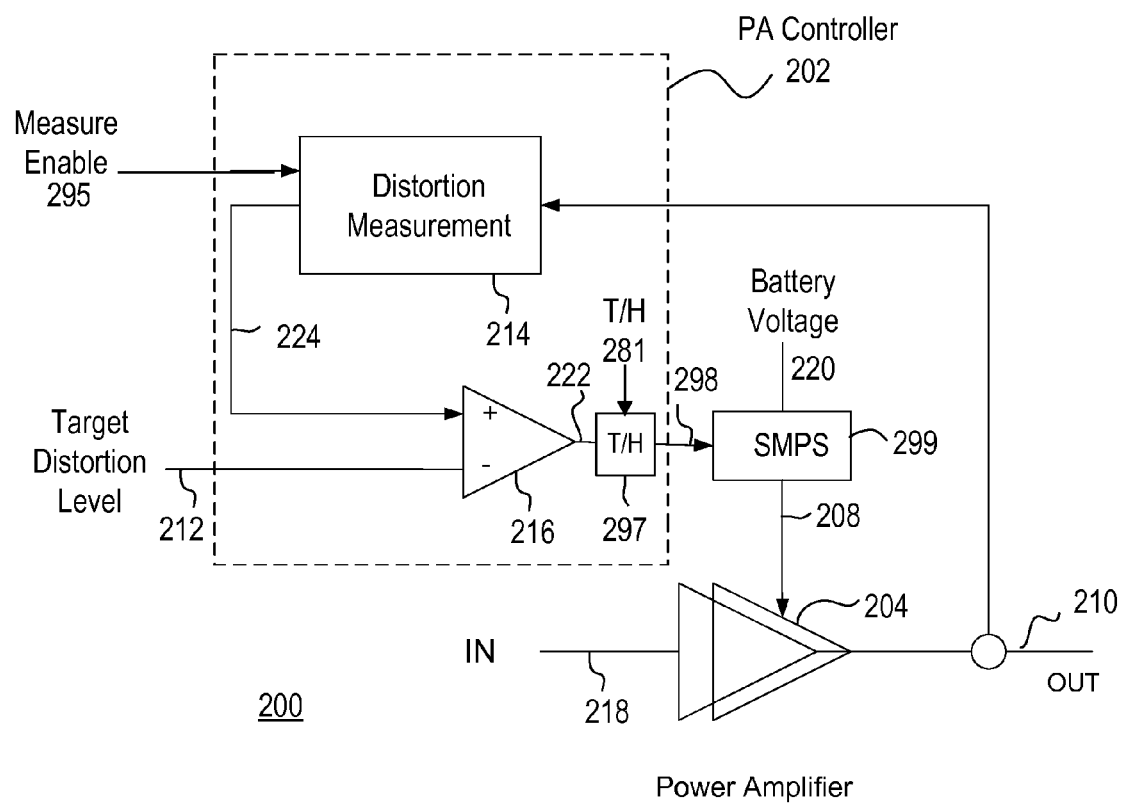
FIG. 2 illustrates an RF PA system that includes a PA controller for measuring distortion and adjusting a supply voltage to a power amplifier in response to the measurement, according to one embodiment of the present invention.

FIG. 2 illustrates an RF power amplifier (PA) system 200 that includes a PA controller 202 for measuring distortion and adjusting a supply voltage 208 to a PA 204 in response to the measurement in accordance with one embodiment of the present invention. The RF PA system 200 comprises, among other components, a power amplifier (PA) 204, a power supply 299, and a PA controller 202. The PA 204 receives an RF input signal 218 from an RF source (not shown) and outputs an amplified RF output signal 210. The power amplifier 204 is biased by a supply voltage 208 provided by a power supply 299 powered by a battery voltage 220. The power supply 299 in this example is a switched mode power supply (SMPS). The PA controller 202 receives the output 210 of the power amplifier 204 and outputs a control signal 298 to the power supply 299 indicating how the power supply 299 should adjust the supply voltage 208.

In one embodiment, the PA controller 202 comprises a distortion measurement module 214, a comparator 216, and a track/hold module 297. The distortion measurement module 214 monitors and measures the level of distortion in the power amplifier output 210 and outputs a signal 224 to the comparator 216 indicating the measured distortion level. The comparator 216 compares the measured distortion level 224 with a target distortion level 212 and outputs a control signal 222 representing the comparison results. In one embodiment, the target distortion level 212 is a fixed level set according to an allowed distortion level for a communication standard (e.g., the 3GPP specification). For example, the target distortion level 212 can be set to a constant level within the range of −33 to −38 dBc. The track/hold module 297 receives the output signal 222 from the comparator 216 and outputs a control signal 298 to the power supply 299. If the track/hold module 297 is in "track" mode in response to a track/hold control signal 281, the output 298 of the track/hold module 297 follows the output signal 222 of the comparator 216. If the track/hold module 297 is in "hold" mode in response to the track/hold control signal 281, the track/hold module 297 continues to output the control signal 298 determined at the most recent time the "hold" mode was entered.

Based on the control signal 298 from the PA controller 202, the power supply 299 adjusts the supply voltage 208 to the PA 204. Generally, if the measured PA distortion level 224 is lower than the target distortion level 212, the power supply 299 lowers the supply voltage 208. If the measured PA distortion level 224 is higher than the target distortion level 212, the power supply 299 raises the supply voltage 208. Thus the PA controller 202 provides a feedback system to maintain the supply voltage 208 to the PA 204 at a low voltage level. This improves the efficiency of the PA 204 while ensuring the PA 204 is generating approximately the target level of distortion 212.

The PA controller 202 can comprises one or more power saving features. In one embodiment, the track/hold module 297 allows the PA controller 202 to "freeze" the power supply 299 at its current supply voltage output 208 in order to save power once the supply voltage 208 has converged to the right value. Furthermore, a measure enable signal 295 can be used to turn on or off components of the distortion measurement module 214 to conserve power during periods when adjustments to the supply voltage 208 are not needed (e.g., when the operating conditions are static and there is no change to the output distortion).

Figure 6:
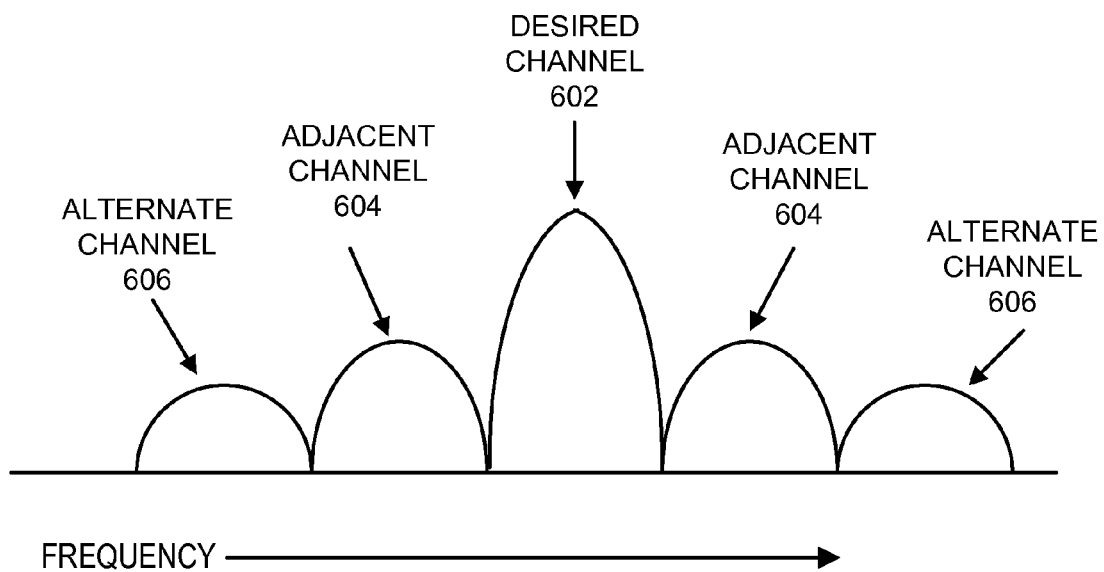
FIG. 6 illustrates an example of frequency channels of a typical RF PA signal output including a desired channel, adjacent channel, and alternate channel.

In one embodiment, the distortion measurement module 214 determines the measured distortion level 224 by computing a ratio of the output power outside the desired frequency channel to the output power within the desired frequency channel. FIG. 6 graphically depicts an example frequency spectrum of a typical RF PA signal output (e.g., a cell phone signal output). The desired channel 602 represents the ideal frequency range of the output signal 210 if no distortion is present. An adjacent channel 604 includes a frequency range next to the frequency range of the desired channel 602. The alternate channel 606 refers to a frequency range next to the adjacent channel 604 in the direction away from the desired channel 602. By measuring output power in the desired channel 602 and outside the desired channel (e.g., in an adjacent channel 604 and/or an alternate channel 606), the output distortion of the PA 204 can be computed. For example, according to various embodiments the measured distortion 224 can be the ratio of the adjacent channel power to the desired channel power, the alternate channel power to the desired channel power, or the sum of the adjacent and alternate channel powers to the desired channel power.

Figure 3:
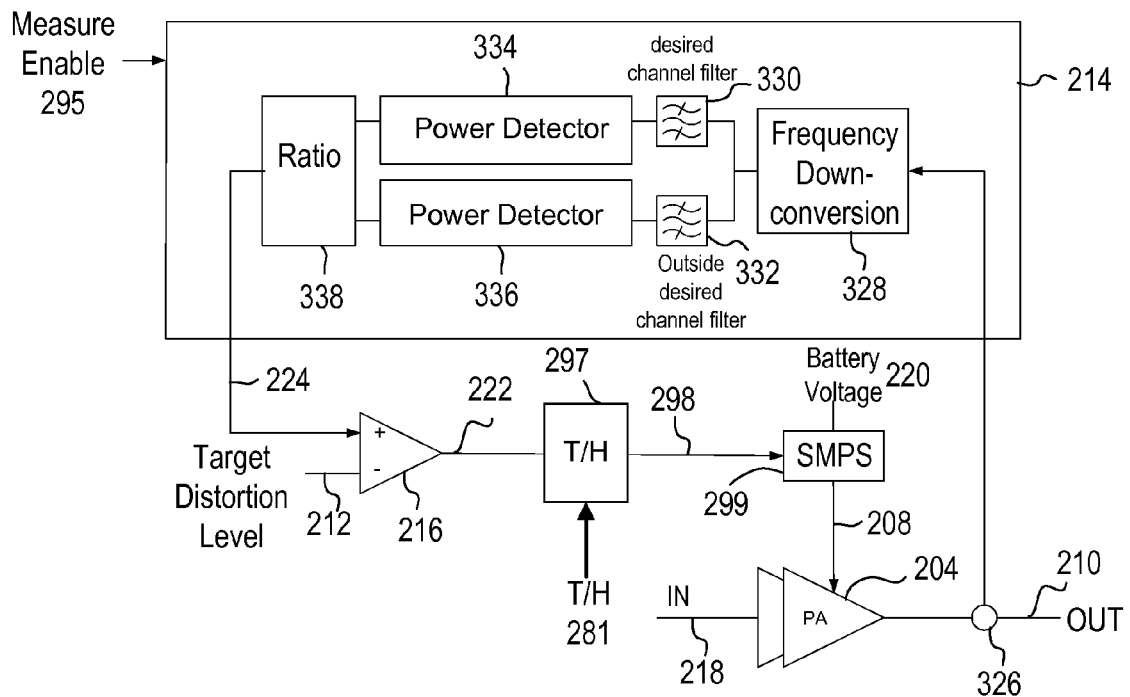
FIG. 3 illustrates the distortion measurement module in the PA controller of FIG. 2 in more detail, according to an embodiment of the present invention.

FIG. 3 illustrates the distortion measurement module 214 in the PA controller 202 of FIG. 2 in more detail in accordance with one embodiment. The distortion measurement module 214 comprises a frequency down-conversion module 328, a pair of filters 330, 332, a pair of power detectors 334, 336, and a ratio calculation module 338. The PA output 210 is sampled through a coupler 326 or other means, and down-converted through a frequency down-conversion module 328. In one embodiment, the frequency down-conversion module 328 comprises an I/Q demodulator. The frequency down-conversion module 328 outputs the down-converted signal to two different filters: a desired channel filter 330 and an outside desired channel filter 332. The filters 330, 332 can be analog or digital filters. Referring to both FIG. 3 and FIG. 6, the desired channel filter 330 is configured to pass frequencies within the desired channel 602 and remove frequencies outside the desired channel 602. The outside desired channel filter 332 is configured to pass frequencies within one or more ranges outside the range of the desired frequency channel 602. According to various embodiments, the frequency ranges passed by the outside desired channel filter 332 can include frequencies in an adjacent channel 604, an alternate channel 606, a combination of an adjacent channel 604 and an alternate channel 606, or any other combination of frequency ranges outside the desired channel 602.

Each filter 330, 332 outputs a filtered signal to a power detector 334, 336 for determining power levels of the filtered signals. As used in combination with the desired channel filter 330, the power detector 334 determines and outputs a power level corresponding to the signal power in the desired channel 602. The power detector 336 determines and outputs a power level corresponding to the signal power outside of the desired channel 602 (e.g., adjacent channel power, alternate channel power, or a combination of the two). The outputs of the power detectors 334, 336 are coupled to the ratio calculation module 338 to determine the ratio of the outside desired channel power to the desired channel power. The ratio of these powers is a measure of distortion 224. For example, the measure of distortion 224 may be given by:

$$\text{Measure of distortion}(224) = \frac{\text{output of power detector}(336)}{\text{output of power detector}(336)}$$

The comparator 216 compares this measured distortion level 224 with a target distortion level 212. If the measured PA distortion level 224 is lower than the target distortion level 212, the power supply 299 lowers the supply voltage 208 in response to the control signal 222 from the comparator 216. If the measured PA distortion level 224 is higher than the target distortion level 212, the power supply 299 raises the supply voltage 208.

Figure 4:
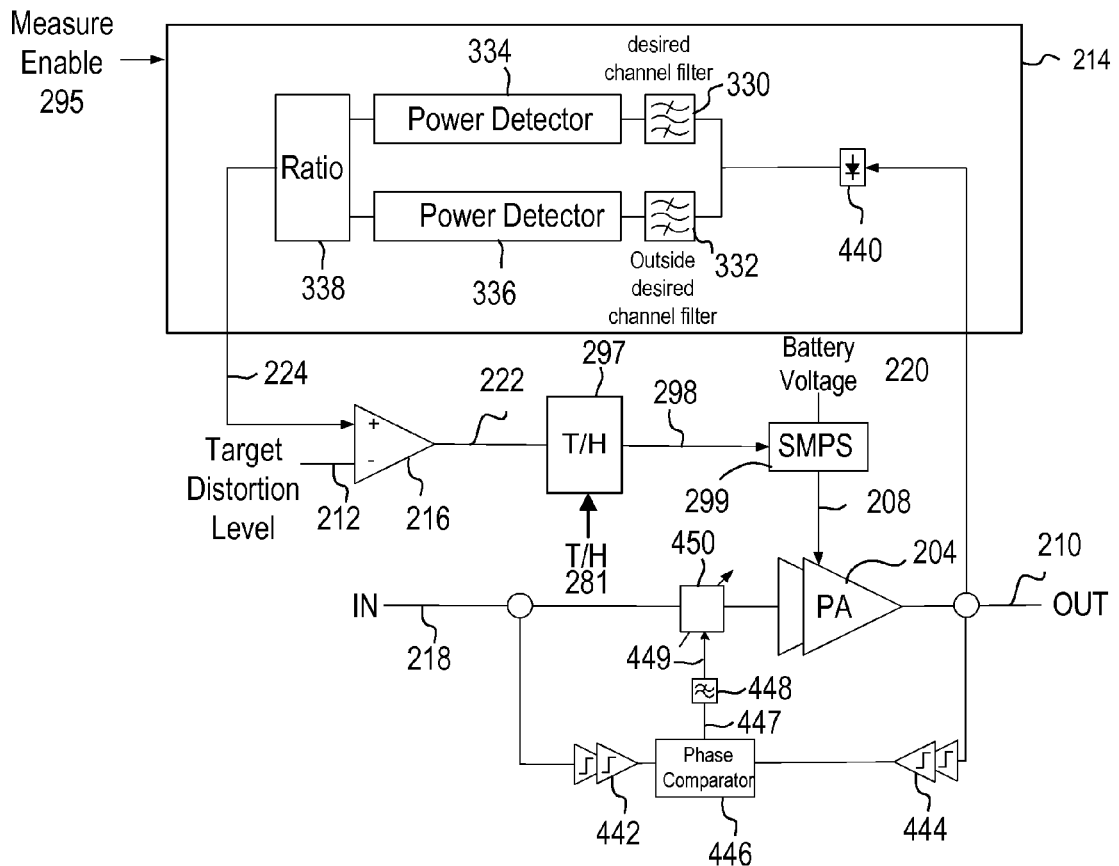
FIG. 4 illustrates the distortion measurement module in the PA controller of FIG. 2 in more detail, according to another embodiment of the present invention.

FIG. 4 illustrates the distortion measurement module 214 in the PA controller 202 of FIG. 2 in more detail according to another embodiment of the present invention. Here, instead of a downconversion, the amplitude of the PA output 210 is sampled by an amplitude detector 440, thus saving the expense and complexity of a downconverter (such as frequency down conversion module 328). The filters 330, 332, power detectors 334, 336, and ratio module 338 estimate the distortion as in FIG. 3. The measured distortion level 224 is again compared to the target distortion level 212, and the power supply 299 adjusts the supply voltage 208 accordingly.

In this embodiment, a phase correction loop may be added to the circuit to correct for phase distortion, thus ensuring that a majority of the distortion in the PA output 210 arises from amplitude distortion and ensuring that the amplitude-only distortion measurement of FIG. 3 is valid. The optional phase correction loop includes two limiters 442, 444, a phase comparator 446, a loop filter (PLF (Phase Loop Filter)) 448, and a phase shifter 450. The phase correction loop monitors the RF input signal 218 and compares the phase of the RF input signal 218 with the phase of the output signal 210 of the PA 204, resulting in a control signal 449 that varies the phase of the RF signal coming out of the phase shifter 450. More specifically, the limiter 442 receives the RF input signal 218 and outputs to the phase comparator 446 an amplitude limited signal mathematically representative of the phase of its input signal 218. The limiter 444 receives the output signal 210 of the PA 204, and outputs its phase signal to the comparator 446. The comparator 446 compares the phases of the output signals of the two limiters 442, 444, and generates a phase error signal 447. The phase error signal 447 is filtered by the loop filter (PLF) 448 to generate the phase control signal 449. The loop filter 448 completes the phase loop and provides the necessary gain, bandwidth limitation, and loop stability required for the phase loop to function properly. The particular loop filter 448 used here can be of any type, and can include multiple integration and derivation stages so as to satisfy the best loop performance. The types of the loop filter may include classical types I, II, and the like. Additionally, an optional delay element (not shown) between limiter 442 and phase comparator 446 may be included to align the phases of the signals into phase comparator 446, to ensure phase comparator 446 operates within an acceptable range of phase differences. The delay element may compensate for the group delay of the PA 204. The phase control signal 449 is input to the phase shifter 450 to control the shifting of the phase of the input RF signal 218 so that the phase of the output signal 210 dynamically matches the phase of the transmitter signal 218.

Even with the inclusion of the circuitry of the phase correction loop, the circuitry shown in FIG. 4 is still simpler in some respects than the circuitry shown in FIG. 3, because it does not require a local oscillator (a necessary part of the I/Q downconverter 328).

The circuits of FIGS. 2-4 provide several advantageous features. For example, the supply voltage 208 is adjusted optimally even when changes occur in the impedance of the circuitry receiving the RF output signal 210. The PA 204 may normally drive circuitry usually consisting of a filter and an antenna, with a typical impedance of 50 Ohms. However, if the antenna is touched or the cellular device is laid down on a metal surface, the load presented by the circuitry receiving the RF output signal 210 is changed, which changes the operating point of the PA 204. The optimum voltage level of the supply voltage 208 thus changes. The PA controller 202 then increases or decreases the supply voltage 208 to match the allowable distortion level set by the target distortion level 212, to a new optimum voltage level as described above. Therefore, the PA controller 202 can maintain a high efficiency while maintaining the level of distortion in the RF output signal 210 even when the load presented to the PA 204 changes.

Both the output power as well as the peak average ratio (PAR) of the RF output signal 210 may change frequently in modern cellular systems. For example, UMTS mobiles may change transmit power levels at least once per 667 usec in a closed loop power control scheme controlled by the base station, and additionally may handle transmit power bursts due to special control signaling at other times. UMTS mobiles also must accommodate transmit modulation PAR changes when the modulation scheme is changed to accommodate higher data rates. An increase in either the output power or PAR of the RF output signal 210 may cause the operating point of the PA 204 to move closer towards compression, resulting in a higher level of distortion. The PA controller 202 responds by increasing the supply voltage 208 until the distortion matches the allowable distortion level set by the target distortion level 212, resulting in a new optimum voltage level as described above. A decrease in either the output power or PAR of the RF output signal similarly causes the PA controller 202 to respond by decreasing supply voltage 208. Thus, the PA controller 202 can maintain a high efficiency while maintaining the level of distortion in the RF output signal 210 even when the RF output power or PAR of the RF output signal 210 changes dynamically.

The components of the PA controller 202 may be enabled in intervals and disabled between the intervals to decrease the power consumption of the PA controller 202 using the measure enable signal 295 and/or the track/hold module 297 as previously described. That is, once the PA controller 202 has set the supply voltage 208, some of the components of the PA controller 202 may be disabled during periods when the operating conditions (e.g. output power, frequency, PAR, impedance mismatch) of the PA 104 remain approximately static while holding constant the supply voltage 208, thus decreasing the overall power consumption of the PA controller 202.

Further, the power consumption of the power supply 299 may be reduced during the periods when the PA controller 202 is disabled. Since the PA supply voltage 208 is held constant during this period, the PA power supply 299 may reduce its operating supply current and thus operate in a more efficient, reduced-bandwidth "slow" mode in which the track/hold module 297 is in hold mode. During the intervals when the PA controller 202 is enabled, the power supply 299 may revert to operation in a "fast" mode in which it is capable of rapidly changing its output voltage 208 in response to the PA controller 202 and the track/hold module 297 is in track mode. In this mode, the power supply 299 may operate with higher supply current because it must support higher bandwidth required to rapidly slew the output voltage 208.

Figure 5:
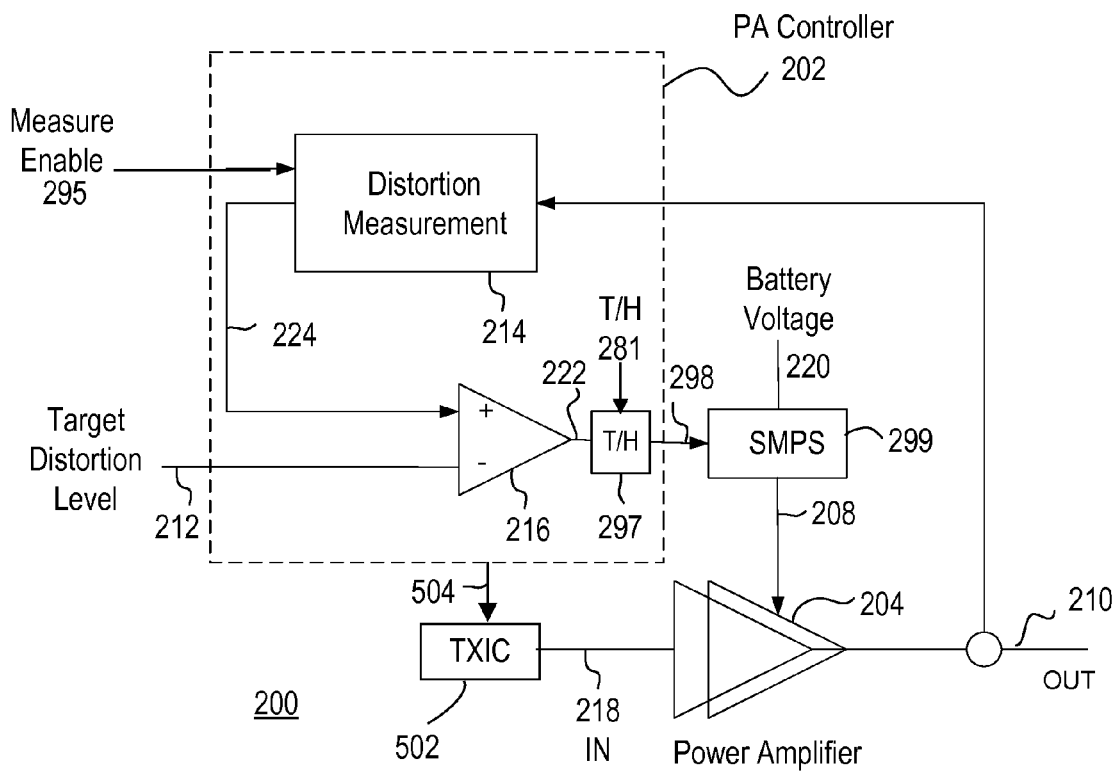
FIG. 5 illustrates an RF PA system with a PA controller that adjusts the input RF signal amplitude responsive to a distortion measurement, according to one embodiment of the present invention.

Adjusting the supply voltage 208 may cause some change in the gain of the PA 204. FIG. 5 illustrates an RF PA system with a PA controller 202 that adjusts the input RF signal 218 in an amplitude control loop. In this embodiment, the PA controller 202 outputs an RF amplitude adjustment control signal 504 to a transmitter (TXIC) 502 providing the RF input signal 218. If the gain change causes an unwanted error in the power level at the RF output signal 210, the RF input signal 218 may be adjusted in amplitude to compensate the unwanted error, thus ensuring that the RF output signal 210 maintains an accurate power level. In one embodiment, the TXIC 502 may adjust the amplitude of its RF signal 218 responsive to the RF amplitude adjustment control signal 504 based on a measurement of the power at the RF output signal 210 and a measurement of the power at RF input signal 218 (measurement not shown). The difference between these powers indicates the gain of the power amplifier. In another embodiment, the PA 204 may be characterized so that the change in its gain is known for a change in the supply voltage 208, and thus the RF amplitude adjustment control signal 504 may control the TXIC 502 to adjust the amplitude of its RF signal 218 based on this information and the supply voltage 208.

Upon reading this disclosure, those of skill in the art will appreciate still additional alternative structural and functional designs for the RF power amplifier controller through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention.

What is claimed is:

1. A radio frequency (RF) power amplifier circuit comprising:
    a power amplifier coupled to receive and amplify an input signal to generate an output signal;
    a distortion measurement module receiving the output signal of the power amplifier and determining a measured distortion level of the output signal of the power amplifier;
    a comparator receiving the measured distortion level from the distortion measurement module and a target distortion level, and generating a power supply control signal indicative of a difference between the measured distortion level and the target distortion level; and
    a power supply coupled to receive the power supply control signal from the comparator and adjust a supply voltage to the power amplifier based on the power supply control signal,
    wherein the measured distortion level comprises a ratio of a first output power of a first portion of the output signal outside a desired frequency channel to a second output power of a second portion of the output signal within the desired frequency channel.

2. The RF power amplifier circuit of claim 1, wherein the power supply control signal causes the power supply to lower the supply voltage responsive to the power supply control signal indicating that the measured distortion level is lower than the target distortion level, and wherein the power supply control signal causes the power supply to raise the supply voltage responsive to the power supply control signal indicating that the measured distortion level is higher than the target distortion level.

3. The RF power amplifier circuit of claim 1, wherein the first portion of the output signal outside the desired frequency channel comprises the first portion of the output signal in adjacent frequency channels adjacent to the desired frequency channel.

4. The RF power amplifier circuit of claim 1, wherein the first portion of the output signal outside the desired frequency channel comprises the first portion of the output signal in alternate frequency channels outside the desired frequency channel.

5. The RF power amplifier circuit of claim 1, wherein the first portion of the output signal outside the desired frequency channel comprises a portion of the output signal in adjacent frequency channels adjacent to the desired frequency channel and a portion of the output signal in alternate frequency channels outside the desired frequency channels.

6. The RF power amplifier circuit of claim 1, wherein the distortion measurement module comprises:
    a measure enable input receiving a measure enable signal for turning on or off one or more components of the distortion measurement module.

7. The RF power amplifier circuit of claim 1, further comprising:
    a phase correction loop determining a phase error signal indicative of a phase difference between phases of the input signal and the output signal and adjusting the phase of the input signal to reduce phase distortion generated by the power amplifier.

8. The RF power amplifier circuit of claim 1, further comprising:
    an amplitude control loop outputting an RF amplitude adjustment control signal coupled to control an amplitude of the input signal to the power amplifier based on a level of the supply voltage to the power amplifier.

9. A radio frequency (RF) power amplifier circuit comprising:
    a power amplifier coupled to receive and amplify an input signal to generate an output signal;
    a distortion measurement module receiving the output signal of the power amplifier and determining a measured distortion level of the output signal of the power amplifier;
    a comparator receiving the measured distortion level from the distortion measurement module and a target distortion level, and generating a power supply control signal indicative of a difference between the measured distortion level and the target distortion level;

a power supply coupled to receive the power supply control signal from the comparator and adjust a supply voltage to the power amplifier based on the power supply control signal; and a track/hold module coupled between the comparator and the power supply, the track/hold module receiving a track/hold control signal for configuring the track/hold module in a track mode or a hold mode, wherein the track/hold module holds the power supply control signal at its current value responsive to the track/hold control signal configuring the track/hold module in the hold mode, and wherein the track/hold module allows the power supply control signal to change according to an output of the comparator responsive to the track/hold control signal configuring the track/hold module in the track mode.

10. A radio frequency (RF) power amplifier circuit comprising:

a power amplifier coupled to receive and amplify an input signal to generate an output signal;

a distortion measurement module receiving the output signal of the power amplifier and determining a measured distortion level of the output signal of the power amplifier;

a comparator receiving the measured distortion level from the distortion measurement module and a target distortion level, and generating a power supply control signal indicative of a difference between the measured distortion level and the target distortion level; and a power supply coupled to receive the power supply control signal from the comparator and adjust a supply voltage to the power amplifier based on the power supply control signal, wherein the distortion measurement module comprises:

a desired channel filter filtering the output signal of the power amplifier, wherein the desired channel filter passes frequencies of the output signal within the desired frequency channel and removes frequencies of the output signal outside the desired channel;

a first power detector receiving the filtered output signal from the desired channel filter and generating a desired channel output power signal indicative of a power level of the filtered output signal received from the desired channel filter;

an outside desired channel filter filtering the output signal of the power amplifier, wherein the outside desired channel filter passes frequencies within one or more frequency ranges outside the desired frequency channel and removes frequencies of the output signal within the desired channel;

a second power detector receiving the filtered output signal from the outside desired channel filter and generating an outside desired channel output power signal indicative of a power level of the filtered output signal received from the outside desired channel filter; and a ratio calculation module receiving the desired channel output power signal and the outside desired channel output power signal and computing a ratio of the outside desired channel output power signal to the desired channel output power signal, wherein the ratio is indicative of the measured distortion level.

11. The RF power amplifier circuit of claim 10, wherein the distortion measurement module further comprises:

a coupler receiving the output signal of the power amplifier and generating a sampled output signal; and a frequency downconversion module receiving the sampled output signal from the coupler, downconverting the sampled output signal, and providing the downsampled output signal to the desired channel filter and the outside desired channel filter.

12. The RF power amplifier circuit of claim 10, wherein the distortion measurement module further comprises:

an amplitude detector coupled between the output signal of the power amplifier and the desired channel filter and between the output signal of the power amplifier and the outside desired channel filter, the amplitude detector detecting an amplitude of the output signal from the power amplifier and providing the detected amplitude output to the desired channel filter and the outside desired channel filter.

13. A radio frequency (RF) power amplifier circuit comprising:

a power amplifier coupled to receive and amplify an input signal to generate an output signal;

a distortion measurement module receiving the output signal of the power amplifier and determining a measured distortion level of the output signal of the power amplifier;

a comparator receiving the measured distortion level from the distortion measurement module and a target distortion level, and generating a power supply control signal indicative of a difference between the measured distortion level and the target distortion level;

a power supply coupled to receive the power supply control signal from the comparator and adjust a supply voltage to the power amplifier based on the power supply control signal; and an amplitude control loop outputting an RF amplitude adjustment control signal coupled to control an amplitude of the input signal to the power amplifier based on a measurement of power at the output signal of the power amplifier and a measurement of the power at the input signal of the power amplifier.

14. A power amplifier controller circuit for controlling a power amplifier, the power amplifier coupled to receive and amplify an input signal to generate an output signal, the power amplifier biased by a supply voltage provided by a power supply, the power amplifier controller circuit comprising:

a distortion measurement module receiving the output signal of the power amplifier and determining a measured distortion level of the output signal of the power amplifier; and a comparator receiving the measured distortion level from the distortion measurement module and a target distortion level, and generating a power supply control signal indicative of a difference between the measured distortion level and the target distortion level, wherein the power supply control signal is outputted to the power supply and causes the power supply to adjust the supply voltage to the power amplifier based on the power supply control signal, wherein the measured distortion level comprises a ratio of a first output power of a first portion of the output signal outside a desired frequency channel to a second output power of a second portion of the output signal within the desired frequency channel.

15. The power amplifier controller circuit of claim 14, wherein the power supply control signal causes the power supply to lower the supply voltage responsive to the power supply control signal indicating that the measured distortion level is lower than the target distortion level, and wherein the power supply control signal causes the power supply to raise the supply voltage responsive to the power supply control signal indicating that the measured distortion level is higher than the target distortion level.

16. The power amplifier controller circuit of claim 14, wherein the first portion of the output signal outside the desired frequency channel comprises the first portion of the output signal in adjacent frequency channels adjacent to the desired frequency channel.

17. The power amplifier controller circuit of claim 14, wherein the first portion of the output signal outside the desired frequency channel comprises the first portion of the output signal in alternate frequency channels outside the desired frequency channel.

18. The power amplifier controller circuit of claim 14, wherein the first portion of the output signal outside the desired frequency channel comprises a portion of the output signal in adjacent frequency channels adjacent to the desired frequency channel and a portion of the output signal in alternate frequency channels outside the desired frequency channels.

19. The power amplifier controller circuit of claim 14, wherein the distortion measurement module comprises:
a measure enable input receiving a measure enable signal for turning on or off one or more components of the distortion measurement module.

20. The power amplifier controller circuit of claim 14, further comprising:
a phase correction loop determining a phase error signal indicative of a phase difference between phases of the RF input signal and the RF output signal and adjusting the phase of the RF input signal to reduce phase distortion generated by the power amplifier.

21. The RF power amplifier controller circuit of claim 14, further comprising:
an amplitude control loop outputting an RF amplitude adjustment control signal coupled to control an amplitude of the input signal to the power amplifier based on a level of the supply voltage to the power amplifier.

22. A power amplifier controller circuit for controlling a power amplifier, the power amplifier coupled to receive and amplify an input signal to generate an output signal, the power amplifier biased by a supply voltage provided by a power supply, the power amplifier controller circuit comprising:
a distortion measurement module receiving the output signal of the power amplifier and determining a measured distortion level of the output signal of the power amplifier;
a comparator receiving the measured distortion level from the distortion measurement module and a target distortion level, and generating a power supply control signal indicative of a difference between the measured distortion level and a target distortion level, wherein the power supply control signal is outputted to the power supply and causes the power supply to adjust the supply voltage to the power amplifier based on the power supply control signal; and
a track/hold module coupled between the comparator and the power supply, the track/hold module receiving a track/hold control signal for configuring the track/hold module in a track mode or a hold mode,
wherein the track/hold module holds the power supply control signal at its current value responsive to the track/hold control signal configuring the track/hold module in the hold mode, and wherein the track/hold module allows the power supply control signal to change according to an output of the comparator responsive to the track/hold control signal configuring the track/hold module in the track mode.

23. A power amplifier controller circuit for controlling a power amplifier, the power amplifier coupled to receive and amplify an input signal to generate an output signal, the power amplifier biased by a supply voltage provided by a power supply, the power amplifier controller circuit comprising:
a distortion measurement module receiving the output signal of the power amplifier and determining a measured distortion level of the output signal of the power amplifier; and
a comparator receiving the measured distortion level from the distortion measurement module and a target distortion level, and generating a power supply control signal indicative of a difference between the measured distortion level and a target distortion level, wherein the power supply control signal is outputted to the power supply and causes the power supply to adjust the supply voltage to the power amplifier based on the power supply control signal, wherein the distortion measurement module comprises:
a desired channel filter filtering the output signal of the power amplifier, wherein the desired channel filter passes frequencies of the output signal within the desired frequency channel and removes frequencies of the output signal outside the desired channel;
a first power detector receiving the filtered output signal from the desired channel filter and generating a desired channel output power signal indicative of a power level of the filtered output signal received from the desired channel filter;
an outside desired channel filter filtering the output signal of the power amplifier, wherein the outside desired channel filter passes frequencies within one or more frequency ranges outside the desired frequency channel and removes frequencies of the output signal within the desired channel;
a second power detector receiving the filtered output signal from the outside desired channel filter and generating an outside desired channel output power signal indicative of a power level of the filtered output signal received from the outside desired channel filter; and
a ratio calculation module receiving the desired channel output power signal and the outside desired channel output power signal and computing a ratio of the outside desired channel output power signal to the desired channel output power signal, wherein the ratio is indicative of the measured distortion level.

24. The power amplifier controller circuit of claim 23, wherein the distortion measurement module further comprises:
a coupler receiving the output signal of the power amplifier and generating a sampled output signal; and
a frequency downconversion module receiving the sampled output signal from the coupler, downconverting the sampled output signal, and providing the downsampled output signal to the desired channel filter and the outside desired channel filter.

25. The power amplifier controller circuit of claim 23, wherein the distortion measurement module further comprises:
an amplitude detector coupled between the output signal of the power amplifier and the desired channel filter and between the output signal of the power amplifier and the outside desired channel filter, the amplitude detector detecting an amplitude of the output signal from the power amplifier and providing the detected amplitude output to the desired channel filter and the outside desired channel filter.

26. A power amplifier controller circuit for controlling a power amplifier, the power amplifier coupled to receive and amplify an input signal to generate an output signal, the power amplifier biased by a supply voltage provided by a power supply, the power amplifier controller circuit comprising:
- a distortion measurement module receiving the output signal of the power amplifier and determining a measured distortion level of the output signal of the power amplifier;
- a comparator receiving the measured distortion level from the distortion measurement module and a target distortion level, and generating a power supply control signal indicative of a difference between the measured distortion level and a target distortion level, wherein the power supply control signal is outputted to the power supply and causes the power supply to adjust the supply voltage to the power amplifier based on the power supply control signal; and
- an amplitude control loop outputting an RF amplitude adjustment control signal coupled to control an amplitude of the input signal to the power amplifier based on a measurement of power at the output signal of the power amplifier and a measurement of the power at the input signal of the power amplifier.

* * * * *